United States Patent
Wu

[19]

[11] Patent Number: 6,084,275
[45] Date of Patent: *Jul. 4, 2000

[54] DOUBLE CODING MASK READ ONLY MEMORY (MASK ROM) FOR MINIMIZING BAND-TO-BAND LEAKAGE

[75] Inventor: Shye-Lin Wu, Hsinchu, Taiwan

[73] Assignee: Texas Instruments - Acer Incorporated, Hsinchu, Taiwan

[ * ] Notice: This patent issued on a continued prosecution application filed under 37 CFR 1.53(d), and is subject to the twenty year patent term provisions of 35 U.S.C. 154(a)(2).

[21] Appl. No.: 09/072,291

[22] Filed: May 4, 1998

[51] Int. Cl.[7] .......................... H01L 29/76; H01L 29/94; H01L 31/062; H01L 31/113; H01L 31/119

[52] U.S. Cl. .......................... 257/390; 257/391; 257/408; 257/324

[58] Field of Search .......................... 257/390, 391, 257/408, 336, 344, 324

[56] References Cited

U.S. PATENT DOCUMENTS

| | | |
|---|---|---|
| 5,081,052 | 1/1992 | Kobayashi et al. ...................... 257/390 |
| 5,200,802 | 4/1993 | Miller ...................................... 257/390 |
| 5,372,961 | 12/1994 | Noda ......................................... 437/45 |
| 5,397,908 | 3/1995 | Dennison et al. ...................... 257/390 |
| 5,536,962 | 7/1996 | Pfiester .................................... 257/391 |
| 5,538,906 | 7/1996 | Aoki .......................................... 437/29 |
| 5,571,739 | 11/1996 | Hong ......................................... 437/48 |
| 5,597,753 | 1/1997 | Sheu et al. ................................ 437/52 |
| 5,793,086 | 8/1998 | Ghio et al. ............................... 257/390 |

Primary Examiner—Mahshid Saadat
Assistant Examiner—Jesse A. Fenty
Attorney, Agent, or Firm—Harness, Dickey & Pierce, P.L.C.

[57] ABSTRACT

The present invention includes a normal NMOS device region and a NMOS cell region for coding. An isolation structure is formed between the normal NMOS device region and the NMOS cell region. A gate oxide is formed on the normal NMOS device region and a coding oxide is formed on the NMOS cell region. A polysilicon layer is formed on the gate oxide. Gates are respectively formed on the polysilicon layer and the coding oxide. Spacers are formed on the side walls of the gates. LDD structures are formed under the spacers and adjacent to the gates. Source and drain regions are formed next to the LDD structures. A p type conductive region is formed adjacent to the surface of the NMOS cell region and under the coding oxide.

20 Claims, 6 Drawing Sheets

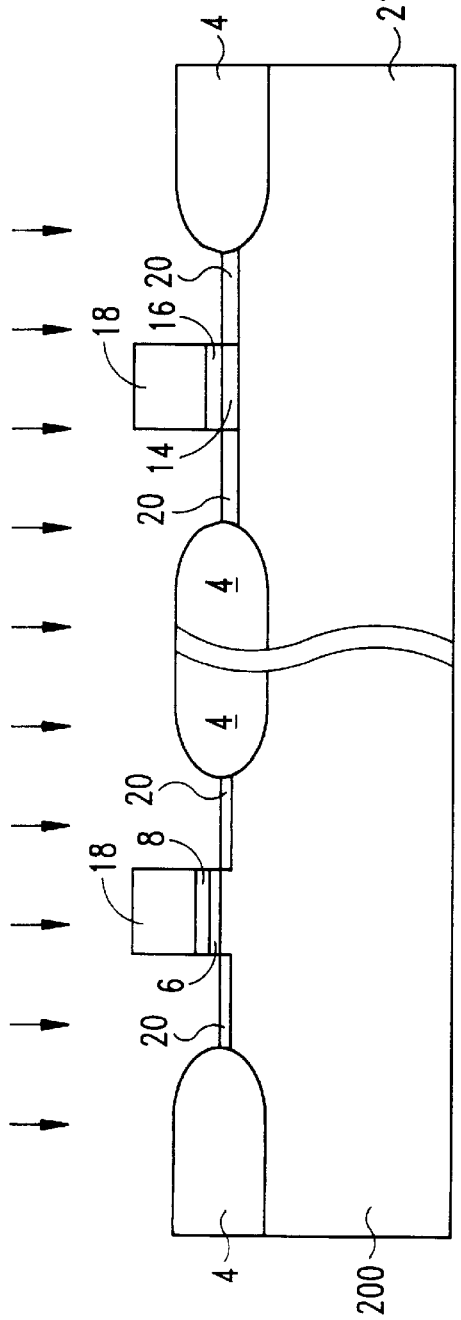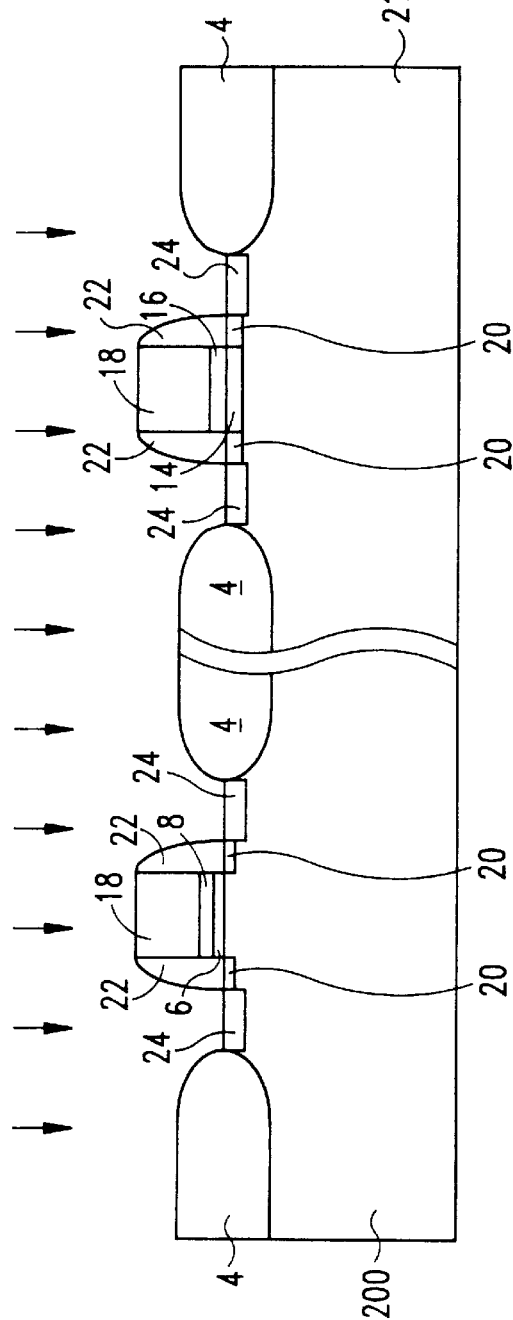

6,084,275

DOUBLE CODING MASK READ ONLY MEMORY (MASK ROM) FOR MINIMIZING BAND-TO-BAND LEAKAGE

FIELD OF THE INVENTION

The present invention relates to semiconductor devices, and specifically relates to semiconductor memories and, more, specifically to a structure of mask read only memories for minimizing band-to-band leakage.

BACKGROUND

Memory devices are driven by new applications and the requirements of the future. Advancements in the fields of computers and communications will require large quantities of each of the species of memories. For example, computer interfaces will be operated by speech processing or vision processing, and other communication interfaces, all of which require a significant amount of memory. Memory technology will continue to move in the direction of increased numbers of devices in a wafer. Read only memory (ROM) devices include ROM cells for coding data and a peripheral controlling devices to control the operation of the cells. Each bit of data is stored in a cell, which is a single n-channel transistor or ROM cell. As is well known in the art, the programming of the ROM is executed by controlling a threshold voltage of the MOS transistors constructing the memory cell by the implantation of dopant.

In general, a mask ROM includes devices with different threshold voltages. A type of device is formed in an active area and another type of device with a threshold voltage mask is formed in another active area during the process. In MOS transistors for a mask ROM, the threshold voltages of the channel regions under the gates are set to the same before data writing. Thereafter, ions are selectively implanted into determined regions to differentiate the threshold voltages thereof for data writing. One of the methods that involves differentiating the threshold voltages is achieved by ion implantation of some of the transistor gates. This method raises the threshold voltage of the n-channel device by doping boron with a heavy dose. The prior art relating to the ROM can be seen in U.S. Pat. No. 5,372,961 and U.S. Pat. No. 5,538,906 disclosed by Noda and Aoki, respectively. The process of ion implantation having high dose boron through the sacrificial oxide or the polysilicon gate into the substrate is widely used to fabricate the normally off mask ROM devices.

However, the high dose boron implantation results in a lower junction breakdown voltage of the coded MOS and, more importantly, to a very high leakage current between the adjacent bit lines. As mentioned in U.S. Pat. No. 5,597,753 disclosed by Sheu, the high leakage current results in very high standby current. Another problem occurs with the ROM code implantation. As is known in the art, after the code implantation is carried out, a thermal process is used to activate the implanted dopant which will cause counter doping of the adjacent bit lines, thereby increasing the bit line resistance and substantially degrading the performance of the ROM devices. One prior art reference which teaches the reduction of the bit line resistance is disclosed by Hong in U.S. Pat. No. 5,571,739.

SUMMARY

The object of the present invention is to provide a mask ROM memory to minimize band-to-band leakage. The substrate includes a normal NMOS device region and a NMOS cell region for coding. A field oxide region is formed between the normal NMOS device region and the NMOS cell region. A gate oxide is formed on the normal NMOS device region and a coding oxide is formed on the NMOS cell region, respectively. The thickness of the coding oxide layer 16 is about 200 to 800 angstroms. A polysilicon layer is formed on the gate oxide. Polysilicon gates are respectively formed on the polysilicon layer and the coding oxide. Oxide spacers are formed on the side walls of the polysilicon gates. LDD structures are formed under the oxide spacers and adjacent to the polysilicon gates. Source and drain regions are formed next to the LDD structure. A p type conductive region is formed adjacent the surface of the NMOS cell region and under the coding oxide. The dopant concentration of the p type conductive region is about 5E11 to 5E14 atoms/cm$^3$.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein:

FIG. 7 is a cross-sectional view of a semiconductor substrate illustrating the step of performing a second ion implantation according to the present invention.

FIG. 8 is a cross-sectional view of a semiconductor substrate illustrating the steps of forming spacers and performing a third ion implantation according to the present invention.

DETAILED DESCRIPTION

The present invention proposes a method with double coding processes to fabricate normally off mask ROM devices. With the processes according to the present invention, the disadvantage mentioned in the background will be eliminated. The high dose coding implant-induced counter doping of the adjacent bit lines can be minimized. The detailed description can be seen as follows.

Figure 9:
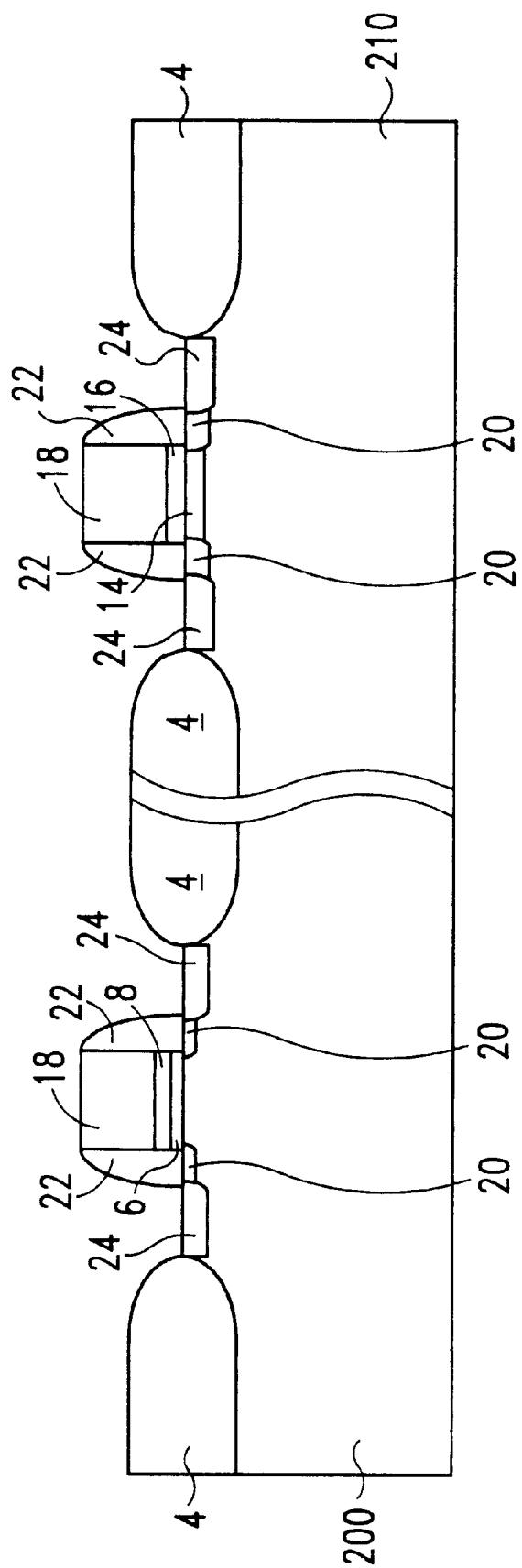
FIG. 9 is a cross-sectional view of a semiconductor substrate illustrating the step of performing a thermal oxidation to activate the dopant according to the present invention.

Turning to FIG. 9, the substrate includes a normal NMOS device region 200 and a NMOS cell region 210 for coding. An isolation structure 4 is formed between the normal NMOS device region 200 and the NMOS cell region 210. A gate oxide 6 is formed on the normal NMOS device region 200 and a coding oxide 16 is formed on the NMOS cell region 210, respectively. A polysilicon layer 8 is formed on the gate oxide 6. Gates 18 are respectively formed on the polysilicon layer 8 and the coding oxide layer 16. Spacers 22 are formed on the side walls of the gates 18. First doped ion regions (LDD) 20 with lightly doped dopant are formed under the spacers and adjacent to the gates 18. Second doped ion regions 24 with relatively heavy doped dopant to the first doped ion regions 20 are formed next to the first doped ion regions 20 for serving as source and drain regions. A p type conductive region 14 with lightly doped dopant is formed adjacent to the surface of the NMOS cell region 210 and under the coding oxide 16. The p type conductive region 14 has higher resistance than the other normal NMOS devices during the operation.

The mask ROM disclosed by the present invention has thicker coding oxide. Further, the coding implant for the mask ROM according to the present invention is performed with low dose boron. In the preferred embodiment, the concentration of the dopant for the p type conductive region 14 is about 5E11 to 5E14 atoms/cm$^3$. The thickness of the coding oxide layer 16 is about 200 to 800 angstroms. The low dose p type conductive region 14 will reduce the high dose coding implant induced leakage. TABLE 1 shows that the combination of low dose boron implant and thicker coding oxide exhibits better characteristics for the normally off mask ROM operation.

Figure 1:
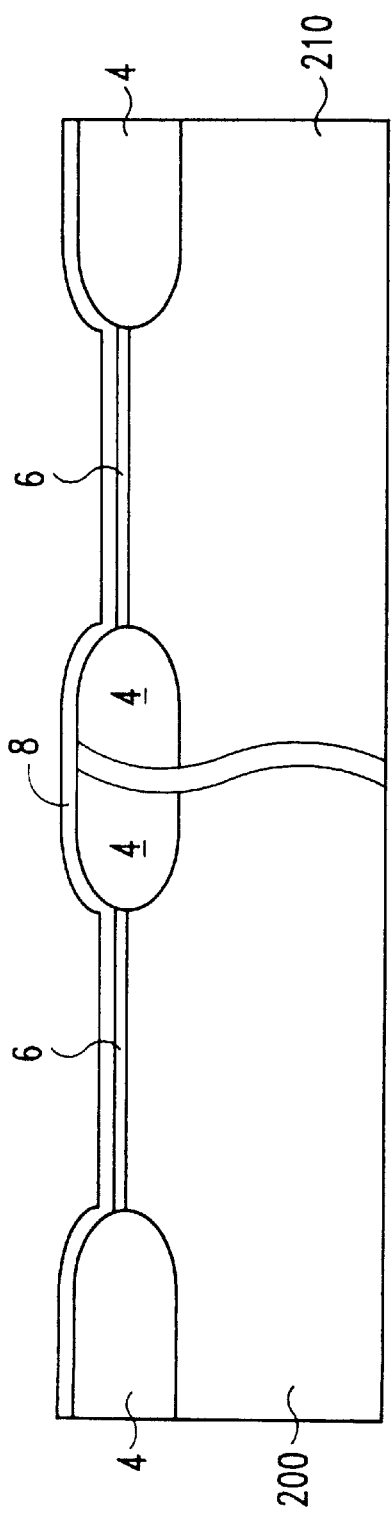
FIG. 1 is a cross-sectional view of a semiconductor substrate illustrating the steps of performing a gate oxide layer and a polysilicon layer on the substrate according to the present invention.

The method for forming the aforesaid mask ROM will be described as follows. Referring to FIG. 1, a single crystal substrate with a <100> crystallographic orientation is used for the preferred embodiment. The substrate is divided into two major portions that are a normal NMOS device region 200 and a NMOS cell region 210 for coding. In this embodiment, thick field oxide (FOX) regions 4 are created for the purposes of isolation. Typically, the FOX regions 4 are created via a photoresist and dry etching to define a silicon nitride-silicon dioxide composite layer. After the photoresist is removed and a wet clean process is performed, thermal oxidation in an oxygen ambient is performed using the composite layer as a hard mask to form the FOX regions 4, to a thickness of about 3000–8000 angstroms. The silicon nitride layer is then typically removed using hot phosphoric acid solution while the silicon dioxide is removed by using diluted HF or BOE solution. Other technology such as trench isolation may be used.

Subsequently, a thin oxide layer 6 is formed both on the normal NMOS device region 200 and the NMOS cell region 210 to act as a gate oxide by using an oxygen-steam ambient, at a temperature between about 800 to 1100 degrees centigrade. Alternatively, the gate oxide 6 may be formed by using other known oxide chemical compositions and procedures. For example, the gate oxide layer 6 can be silicon dioxide formed using a chemical vapor deposition process, with a tetraethylorthosilicate (TEOS) source, at a temperature between about 600 to 800 degrees centigrade and a pressure of about 0.1 to 10 torr. In the preferred embodiment, the thickness of the gate oxide layer 6 is about 15–200 angstroms. After the silicon oxide layer 6 is formed. A polysilicon layer 8 is deposited by chemical vapor deposition on the gate oxide layer 6.

Figure 2:
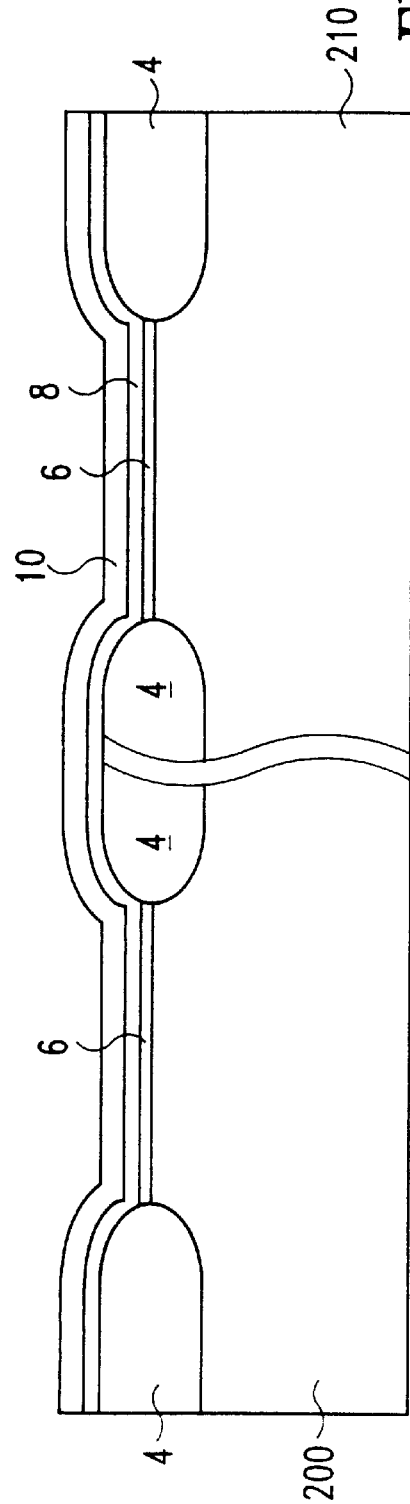
FIG. 2 is a cross-sectional view of a semiconductor substrate illustrating the step of forming a silicon nitride layer over a substrate according to the present invention.

Turning to FIG. 2, a thin silicon nitride layer 10 is then formed on the polysilicon layer 8. In general, the silicon nitride layer 10 can be deposited by any suitable process such as Low Pressure Chemical Vapor Deposition (LPCVD), Plasma Enhance Chemical Vapor Deposition (PECVD), or Electron Cyclotron Remote Chemical Vapor Deposition (ECRCVD). The thickness of the silicon nitride layer is about 200 to 1500 angstroms. Further, the temperature to form the silicon nitride layer 10 is at a range of about 300–800° C. In the preferred embodiment, the reaction gases of forming the silicon nitride layer 10 are selected from $SiH_4$, $NH_3$, $N_2$, $N_2O$ or $SiH_2Cl_2$, $NH_3$, $N_2$, $N_2O$.

Figure 3:
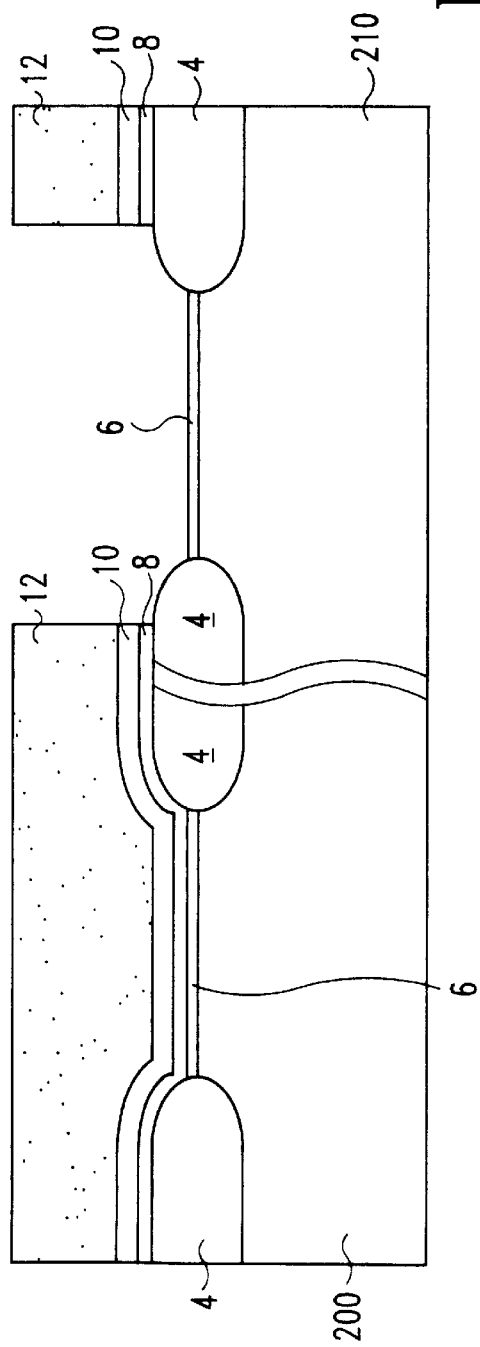
FIG. 3 is a cross-sectional view of a semiconductor substrate illustrating the step of patterning a photoresist on the substrate according to the present invention.

Referring to FIG. 3, a photoresist 12 is patterned over the normal NMOS device region 200 to expose the NMOS cell region 210 by means of conventional lithography process. Afterwards, an etching is performed by using the photoresist 12 as an etching mask to etch back the silicon nitride layer 10 and the polysilicon layer 8 on the NMOS cell region 210. Next, the photoresist 12 is removed by the technology well known in the art.

Figure 4:
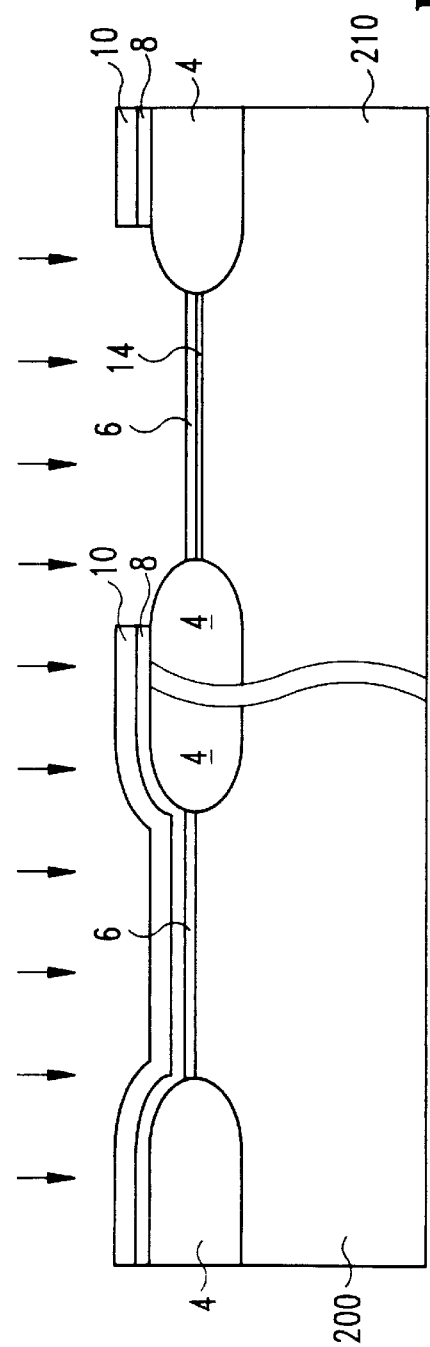
FIG. 4 is a cross-sectional view of a semiconductor substrate illustrating the step of performing a first ion implantation according to the present invention.

Next, a blanket ion implantation with p type conductive dopant such as $BF_2$ or boron is carried out to form a p type lightly doped drain region (p type conductive region) 14 adjacent to the surface of the NMOS cell region 210, as shown in FIG. 4. The implantation is performed with low a dose to increase the surface boron concentration for coding. Preferably, the energy and dosage of the implantation are about 5 to 120 KeV, 5E12 to 5E14 atoms/cm$^2$, respectively.

Figure 5:
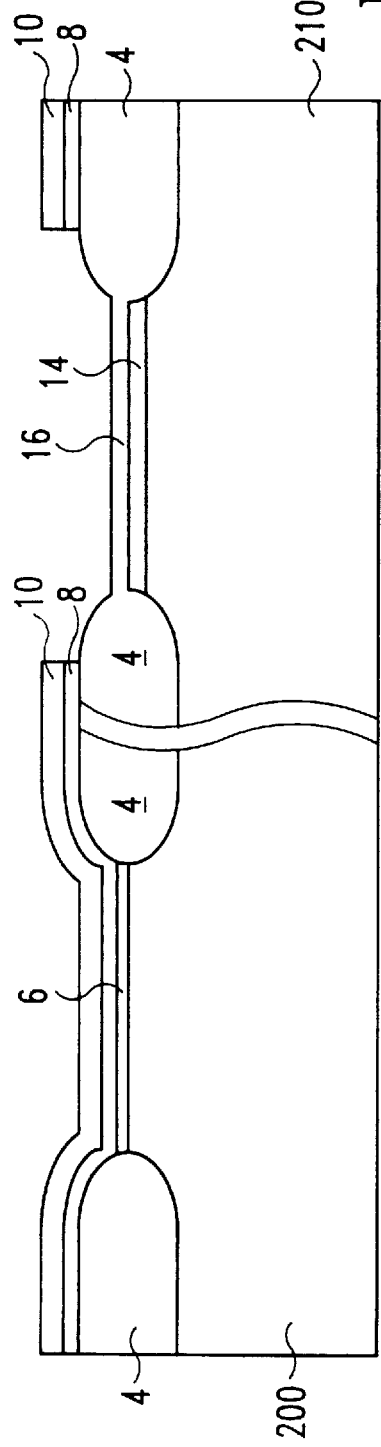
FIG. 5 is a cross-sectional view of a semiconductor substrate illustrating the step of forming a coding oxide layer over the substrate according to the present invention.
Figure 6:
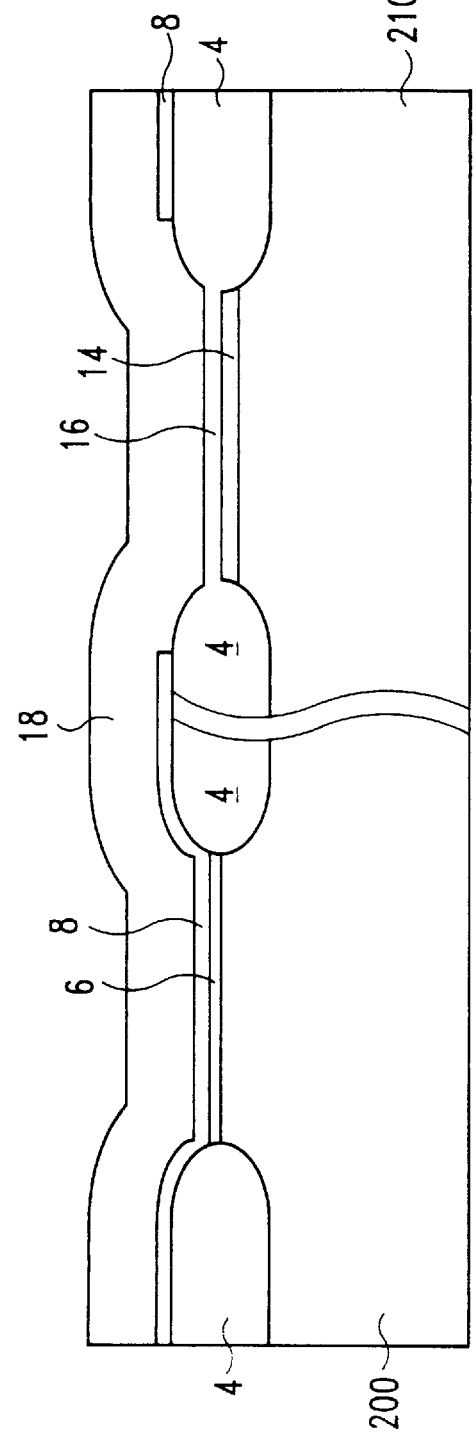
FIG. 6 is a cross-sectional view of a semiconductor substrate illustrating the step of forming a second polysilicon layer on the substrate according to the present invention.

Turning to FIG. 5, a coding oxide layer 16 is formed on the NMOS cell region 210 by a thermal oxidation in an ambient containing oxygen. The silicon nitride layer 10 serves as a hard mask during the oxidation. The temperature for the thermal oxidation is about 750 to 1100 degrees centigrade. In the preferred embodiment, the thickness of the coding oxide layer 16 is about 200 to 800 angstrom that is thicker than the one of the initial gate oxide layer 6. Then, the silicon nitride layer 10 is stripped by using wet etching such as hot phosphorus solution. A second polysilicon layer 18 is successively deposited over both the normally NMOS device region 200 and the NMOS cell region 210, as shown in FIG. 6. In the step, the second polysilicon layer 18 is used to act as a word line.

Referring to FIG. 7, the polysilicon layers 8 and 18, the gate oxide layer 6 and the coding oxide layer 16 are patterned to form the gate structures on the aforementioned normally NMOS device region 200 and the NMOS cell region 210, respectively. A second ion implantation with n conductive type dopant is used to implant ions into the NMOS device region 200 and the NMOS cell region 210 by using the gate structures as a mask, thereby forming n type LDD regions 20 adjacent to the gate structures. Preferably, the dopant for the second ion implantation is phosphorus or arsenic and the implantation is performed with low dosage. The energy and dosage of the implantation are about 5 to 100 KeV, 1E12 to 1E14 atoms/cm$^2$, respectively.

Referring to FIG. 8, an oxide layer is deposited by means of chemical vapor deposition on the gate structures. Side wall spacers 22 are then formed on the side walls of the gate structures by an anisotropically etching back of the oxide layer. Next, a third ion implantation is carried out to dope ions into the substrate. In the preferred embodiment, the step is employed with high dose n conductive type ions, such as arsenic or phosphorus. After the procedure, n conductive type source and drain regions 24 are formed adjacent to the gate structure in the NMOS device region 200 and NMOS cell region 210, respectively. It has to be noted that the concentration of the NMOS cell will be lower than the one of the normal NMOS device due to the fact that the first ion implantation is introduced with p type conductive dopant. The NMOS cell region 210 exhibits high resistance. Thus, the threshold voltage of the NMOS cell region 210 will much higher than that of the normal device in the NMOS device region 200. The energy and dosage of the forth implantation are about 0.5 to 80 KeV, 5E14 to 5E16 atoms/cm$^2$, respectively.

Turning to FIG. 9, a high temperature thermal anneal is performed in an ambient containing a gas that is selected from the group of $N_2$, $O_2$, and $N_2O$ to activate the dopant and therefore forming shallow junction of the devices. In a case, the temperature for this step can range from 800 to 1100 degrees centigrade.

TABLE 1 compares the threshold voltage of various coding process. The coding implant is performed with $BF_2$ by using 100 KeV through pad oxide having 250 angstroms in thickness.

TABLE 1

| sample | coding implant (atoms/cm$^2$) | coding oxide (angstrom) | threshold voltage (V) |
|--------|-------------------------------|-------------------------|-----------------------|
| A | no | no | 0.69 |
| B | 1E14 | no | 2.81 |
| C | 1E14 | 300 | 7.41 |
| D | no | 300 | 1.84 |
| E | 5E14 | no | 3.95 |
| F | 5E13 | 300 | 6.16 |

Figure 10:
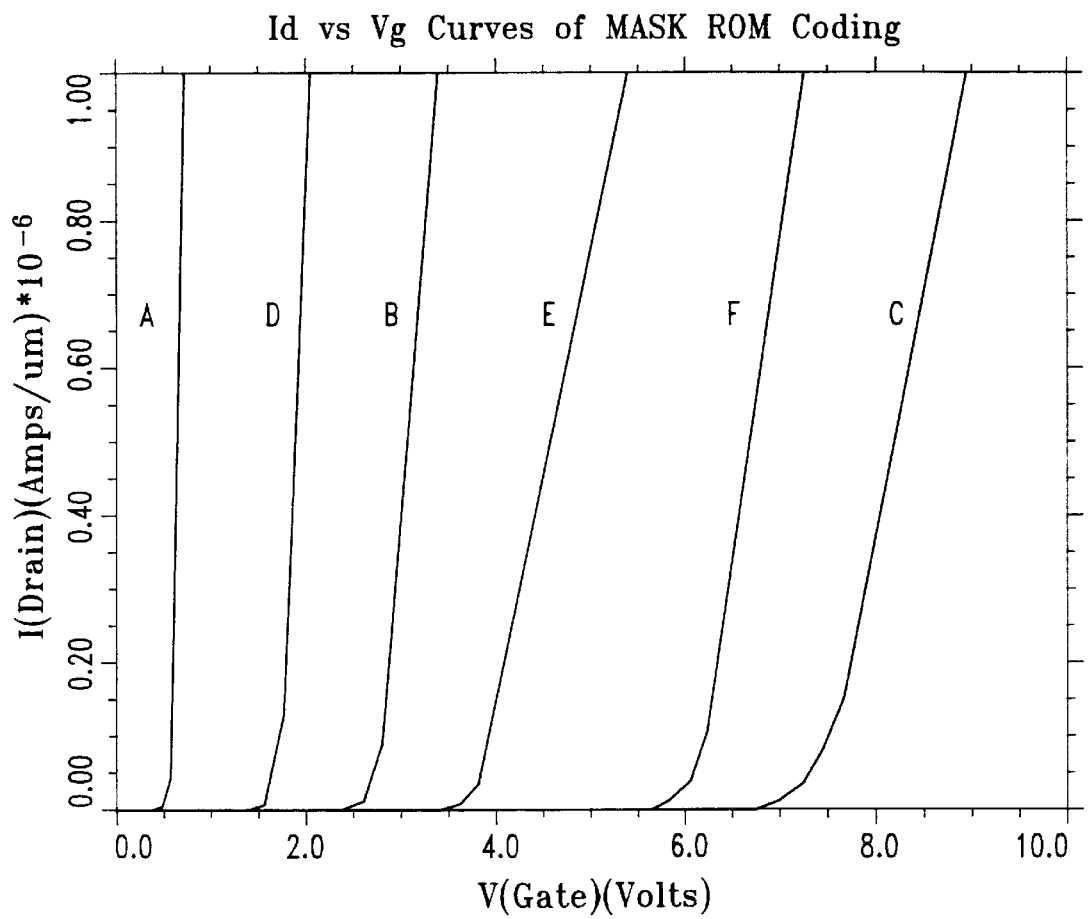
FIG. 10 shows the Id versus Vg curves for different coding conditions.

FIG. 10 shows the Id versus Vg curves of difference coding conditions. It can be seen that the combination of low dose boron implant and thicker gate oxide film exhibits better characteristics for the normally off mask ROM operation. As can be appreciated from the above disclosure, the present invention provides the following advantages: (1) The high dose coding implant induced by a lower junction breakdown and a higher leakage current of the coded NMOS device can be avoided by using a low dose boron or $BF_2$ coding implant; (2) the high dose coding implant induced counter doping of the adjacent bit lines can be minimized; (3) the gate oxide thickness of the proposed coded NMOS devices is much thinner than that of the thick oxide coded NMOS cell.

As is understood by a person skilled in the art, the foregoing embodiments of the present invention are illustrative of the present invention rather than limiting of the present invention. The disclosure is intended to cover various modifications and similar arrangements included within the spirit and scope of the appended claims, the scope of which should be accorded the broadest interpretation so as to encompass all such modifications and similar structure. Accordingly, while the preferred embodiment of the invention has been illustrated and described, it will be appreciated that various changes can be made therein without departing from the spirit and scope of the invention.

What is claimed is:

1. A mask ROM (mask read only memory) device on a substrate having a NMOS device region and a NMOS cell region for coding, said mask ROM comprising:

an isolation structure formed between said NMOS device region and said NMOS cell region;

a gate oxide with a thickness of about 15 to 200 angstroms formed on said NMOS device region;

a coding oxide formed on said NMOS cell region, wherein a thickness of said coding oxide is about 200 to 800 angstroms;

a polysilicon layer formed on said gate oxide of said NMOS device region;

gates respectively formed on said polysilicon layer and said coding oxide;

spacers formed on side walls of said gates;

first N type doped ion regions formed right underneath said spacers;

second N type doped ion regions with relatively heavy doped dopant to said first N type doped ion regions formed next to said first N type doped ion regions for serving as source and drain regions; and a p type conductive region formed between said first N type doped ion regions of said NMOS cell region and right underneath said coding oxide, wherein a dopant concentration of said p type conductive region is about 5E11 to 5E14 atoms/cm$^3$.

2. The mask ROM of claim 1, wherein the dopant of said first doped regions comprises phosphorus.

3. The mask ROM of claim 1, wherein the dopant of said first doped regions comprises arsenic.

4. The mask ROM of claim 1, wherein the dopant of said second doped regions comprises phosphorus.

5. The mask ROM of claim 1, wherein the dopant of said second doped regions comprises arsenic.

6. The mask ROM of claim 1, wherein the dopant of said p type conductive region comprises boron.

7. The mask ROM of claim 1, wherein the dopant of said p type conductive region comprises $BF_2$.

8. The mask ROM of claim 1, wherein said isolation structure includes a field oxide region.

9. The mask ROM of claim 1, wherein said gate oxide includes silicon oxide.

10. The mask ROM of claim 1, wherein the coding oxide includes silicon oxide.

11. The mask ROM of claim 1, wherein said gates are formed of polysilicon.

12. The mask ROM of claim 1, wherein said spacers are formed of oxide.

13. A mask ROM (mask read only memory) device on a substrate, said mask ROM comprising:

a NMOS device having:
a gate oxide layer formed on said substrate;
a polysilicon layer formed on said gate oxide;
a first gate electrode formed on said polysilicon layer;
first spacers formed on side walls of said first gate electrode;
first lightly doped drain regions formed right underneath said first spacers;
first heavily doped ion regions formed adjacent to said first lightly doped drain regions for serving as source and drain regions of said NMOS device;

a NMOS cell for coding having:
a coding oxide layer formed on said substrate having a thickness thicker than said gate oxide layer;
a second gate electrode formed on said coding oxide layer;
second spacers formed on side walls of said second gate electrode;
second lightly doped drain regions formed right underneath said second spacers;
second heavily doped ion regions formed adjacent to said second lightly doped drain regions for serving as source and drain regions of said NMOS cell; and
a p type conductive region formed between said second lightly doped drain regions and underneath said coding oxide layer.

14. The mask ROM of claim 13, wherein said first and second gate electrodes are formed of polysilicon.

15. The mask ROM of claim 13, wherein a dopant of said first and second lightly doped drain regions are selected from the group consisting of phosphorus and arsenic.

16. The mask ROM of claim 13, wherein a dopant of said first and second heavily doped regions are selected from the group consisting of phosphorus and arsenic.

17. The mask ROM of claim 13, wherein said gate oxide layer has a thickness of about 15 to 200 angstrom.

18. The mask ROM of claim 13, wherein said coding oxide layer has a thickness of about 200 to 800 angstrom.

19. The mask ROM of claim 13, wherein a dopant of said p type conductive region is selected from the group consisting of boron and $BF_2$.

20. The mask ROM of claim 13, wherein a dopant concentration of said p type conductive region is about 5E11 to 5E14 atoms/$cm^3$.

* * * * *